US011495742B2

(12) United States Patent
Sun et al.

(10) Patent No.: US 11,495,742 B2
(45) Date of Patent: Nov. 8, 2022

(54) DUAL LAYER DIELECTRIC LINER FOR RESISTIVE MEMORY DEVICES

(71) Applicant: GLOBALFOUNDRIES Singapore Pte. Ltd., Singapore (SG)

(72) Inventors: Jian Xun Sun, Singapore (SG); Juan Boon Tan, Singapore (SG); Tu Pei Chen, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 168 days.

(21) Appl. No.: 16/851,569

(22) Filed: Apr. 17, 2020

(65) Prior Publication Data

US 2021/0328140 A1   Oct. 21, 2021

(51) Int. Cl.
*H01L 45/00* (2006.01)
(52) U.S. Cl.
CPC .......... *H01L 45/1286* (2013.01); *H01L 45/08* (2013.01); *H01L 45/1233* (2013.01); *H01L 45/1253* (2013.01); *H01L 45/16* (2013.01)

(58) Field of Classification Search
CPC .................. H01L 45/1233; H01L 45/1286
See application file for complete search history.

(56) References Cited

U.S. PATENT DOCUMENTS

2020/0287133 A1* 9/2020 Sarkar ................ H01L 45/1286

OTHER PUBLICATIONS

Zhiping Zhang et al., All-Metal-Nitride RRAM Devices, IEEE Electron Device Letters, Jan. 2015, 29-31, vol. 36, No. 1, IEEE, New York, United States.
Chao Chen et al., Bipolar resistive switching in Cu/AlN/Pt non-volatile memory device, Applied Physics Letters, Aug. 2010, 083502-1 to 3, vol. 97, AIP, New York, United States.
Tsung-Ling Tsai et al., Enhanced properties in conductive-bridge resistive switching memory with oxide-nitride bilayer structure, IEEE Electron Device Letters, Oct. 2016, 1284-1287, vol. 37, No. 10, IEEE, New York, United States.
Y. Hayakawa et al., Highly reliable TaOx ReRAM with centralized filament for 28-nm embedded application, Symposium on VLSI Technology Digest of Technical Papers, 2015, T14-15, IEEE, New York, United States.
Pei-Yi Gu et al., Scalability with silicon nitride encapsulation layer for Ti/HfOx pillar RRAM, Proceedings of 2010 International Symposium on VLSI Technology, System and Application, 2010, 146-147, IEEE, New York, United States.
Hee-Dong Kim et al., Stable bipolar resistive switching characteristics and resistive switching mechanisms observed in aluminum nitride-based ReRAM devices, IEEE Transactions on Electron Devices, Oct. 2011, 3566-3573, vol. 58, No. 10, IEEE, New York, United States.
Muxi Yu et al., Encapsulation layer design and scalability in encapsulated vertical 3D RRAM, Nanotechnology, Apr. 4, 2016, 205202 1 to 9, vol. 27, IOP Publishing, England.

* cited by examiner

*Primary Examiner* — Mark V Prenty
(74) *Attorney, Agent, or Firm* — David Cain

(57) ABSTRACT

A resistive memory device is provided. The resistive memory device comprises a first electrode and a resistive layer over the first electrode, the resistive layer having a sidewall. A second electrode is over the resistive layer. An insulating liner is formed on the sidewall of the resistive layer. The insulating liner comprises two layers of different dielectric materials.

18 Claims, 15 Drawing Sheets

DUAL LAYER DIELECTRIC LINER FOR RESISTIVE MEMORY DEVICES

FIELD OF THE INVENTION

The disclosed embodiments relate generally to nonvolatile resistive random access memory (ReRAM) devices, and more particularly, to ReRAM devices with improved reliability, good performance and simple fabrication process.

BACKGROUND

ReRAM technology is one of the promising candidates for advanced nonvolatile memory device options. A ReRAM device generally comprises conducting electrodes and a resistive layer between the conducting electrodes. During device operation, a ReRAM device uses reversible resistance switching between two different resistance states, a low resistance state and a high resistance state. The device is switched between the two different resistance states through the application of suitable switching voltages. The applied voltages causes the formation or breaking of conducting filaments across the resistive layer that results in the low and high resistance states, respectively. The filaments may be formed by oxygen vacancies or metal atoms.

High voltages and frequent voltage changes across the resistive layer may result in high local temperatures leading to reliability issues and performance degradation. For example, uncontrolled migration of oxygen vacancies and metal atoms due to the high local temperatures may result in uncontrolled filament shapes and switch current overshoot. Thus, there is an urgent need for an improved memory device to overcome the challenges mentioned above.

SUMMARY

In an aspect of the present disclosure, a resistive memory device is provided. The resistive memory device comprises a first electrode and a resistive layer over the first electrode, the resistive layer having a sidewall. A second electrode may be over the resistive layer. A first insulating liner may be on the sidewall of the resistive layer, the first insulating liner comprising two layers of different dielectric materials.

In another aspect of the present disclosure, a resistive memory device is provided. The device comprising a first electrode having a first electrode sidewall and a resistive layer over the first electrode, the resistive layer having a sidewall. An insulating liner extending along the first electrode sidewall and the sidewall of the resistive layer, the insulating liner comprises a first barrier layer and a second high thermal conductivity layer. A second electrode may be over the resistive layer.

In yet another aspect of the present disclosure, a method of fabricating a resistive memory device is provided. The method comprises providing a first electrode, providing a resistive layer adjacent to the first electrode and providing a second electrode adjacent to the resistive layer. An insulating liner may be provided on a sidewall of the resistive layer, the insulating liner comprising two layers of different dielectric materials.

Numerous advantages may be derived from the embodiments described below. The embodiments provide a resistive memory device with improved performance and good reliability. The memory device has a higher endurance to repeated resistance switching between high and low resistance states, leading to a longer device lifetime. Controlled filament formation and reduction in switching current overshoot are achieved. The memory device may be easily fabricated with simple and low cost processes without the need of additional masking layers.

BRIEF DESCRIPTION OF THE DRAWINGS

The disclosed embodiments will be better understood from a reading of the following detailed description, taken in conjunction with the accompanying drawings.

Figure 1A:
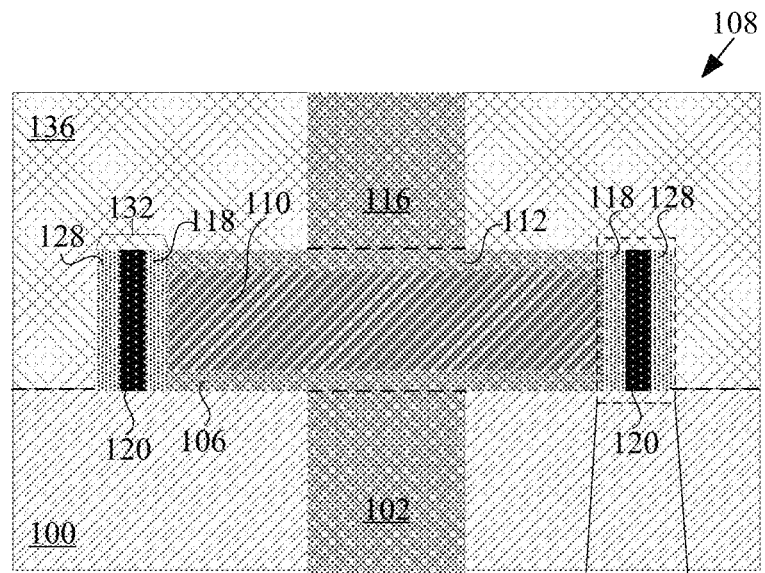
FIG. 1A is a cross-section view of a resistive memory device, according to embodiments of the disclosure.

For simplicity and clarity of illustration, the drawings illustrate the general manner of construction, and certain descriptions and details of well-known features and techniques may be omitted to avoid unnecessarily obscuring the discussion of the described embodiments of the device. Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

FIG. 1A is a cross-section view of a resistive memory device 108, according to embodiments of the disclosure. The resistive memory device 108 may be a resistive random access memory (ReRAM) device including a conductive bridge random access memory (CBRAM) or an oxide random access memory (OxRAM). Referring to FIG. 1A, the device 108 comprises a first electrode 106 and a resistive layer 110 may be formed over the first electrode 106, the resistive layer 110 having at least a sidewall. An insulating liner 132 may be formed on the sidewall of the resistive layer 110, the insulating liner 132 having at least two layers, a first layer 118 and a second layer 120. The first layer 118 and the second layer 120 of the insulating liner 132 may be made of different dielectric materials. The first layer 118 may be a barrier layer and the second layer 120 may be made of a material with high thermal conductivity. A second electrode 112 may be over the resistive layer 110. The first electrode 106, second electrode 112 and resistive layer 110 may each have a width defined by their respective interfaces with the insulating liner 132. The widths of the first electrode 106, second electrode 112 and resistive layer 110 may be equal as shown in this embodiment. In other embodiments, the width of the first or second electrode may differ from the width of the resistive layer and/or the other electrode.

The term "high thermal conductivity" may refer to thermal conductivity larger than or equal to 100 W/mK at room temperature. The first layer 118 may comprise silicon nitride or NBlok (SiCNH). The second layer 120 may comprise aluminum nitride, boron nitride, gallium nitride, silicon carbide, boron phosphide, aluminum phosphide, gallium phosphide or boron arsenide. In one embodiment, the first layer 118 may be formed next to the resistive layer 110 and the second layer 120 may be formed next to the first layer 118. In further embodiments, the second layer 120 may be formed next to the resistive layer 110 and the first layer 118 may be formed next to the second layer 120. The first layer 118 may have a thickness range in the order of 1 nm to 10 nm. The second layer 120 may have a thickness range in the order of 1 nm to 20 nm. From a top down perspective, the resistive memory device 108 may have a circular, square, rectangular or elliptical shape.

Figure 1B:
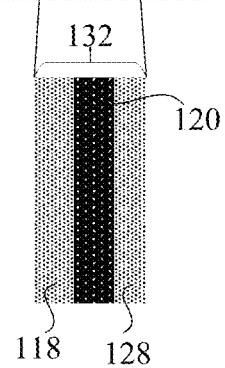
FIG. 1B is an enlarged view of an insulating liner illustrated in FIG. 1A, according to embodiments of the disclosure.

FIG. 1B is an enlarged view of the insulating liner 132 illustrated in FIG. 1A, according to embodiments of the disclosure. Referring to FIG. 1B, the insulating liner 132 may further comprise a third layer 128, the third layer 128 of the insulating liner 132 may be a barrier layer. The third layer 128 is an optional layer and may comprise silicon nitride or Nblok (SiCNH). In one embodiment, the third layer 128 of the insulating liner 132 may be made of the same material as the first layer 118. The third layer 128 may be formed next to the second layer 120.

Referring to FIG. 1A, the first electrode 106 has at least a sidewall and the insulating liner 132 may extend over the sidewall of the first electrode 106. The second electrode 112 has at least a sidewall and the insulating liner 132 may extend over the sidewall of the second electrode 112. In one embodiment, the first electrode 106 may be made of conductive materials with high thermal conductivity comprising aluminum (Al), copper (Cu), tungsten (W), molybdenum (Mo), any other suitable material or its combination. In further embodiments, the second electrode 112 may be made of conductive materials with high thermal conductivity comprising aluminum (Al), copper (Cu), tungsten (W), molybdenum (Mo), any other suitable material or its combination. In one embodiment, the first electrode 106 and the second electrode 112 may be made of the same material. The insulating liner 132 may extend across at least the sidewall of the resistive layer 110, the insulating liner 132 having a first end portion and a second end portion. The first end portion of the insulating liner 132 may extend across at least the sidewall of the first electrode 106. The second end portion of the insulating liner 132 may extend across at least the sidewall of the second electrode 112. In one embodiment, the insulating liner 132 may be electrically insulating.

The resistive memory device 108 may further comprise a first contact 102 and the first electrode 106 may be formed adjacent to the first contact 102. The resistive memory device 108 may further comprise a second contact 116 formed adjacent to the second electrode 112. Dashed lines are used to indicate interfaces between the first contact 102 and the first electrode 106 and between the second contact 116 and the second electrode 112. The first contact 102 and the second contact 116 may be made of conductive materials with high thermal conductivity comprising aluminum (Al), copper (Cu), tungsten (W), molybdenum (Mo), any other suitable material or its combination. In one embodiment, the first contact 102 and the second contact 116 may be made of the same material as the first electrode 106 and the second electrode 112. In further embodiments, the first contact 102 may be made of a different material from the second contact 116. In further embodiments, the first contact 102 and the second contact 116 may be made of a different material from the first electrode 106 and the second electrode 112.

The resistive memory device 108 may be surrounded by interlayer dielectric (ILD) layers 100 and 136. In one embodiment, the ILD layers 100 and 136 may be made of tetraethyl orthosilicate (TEOS), silicon dioxide, silicon oxynitride, borosilicate glass (BSG), phosphoric silicate glass (PSG), fluorinated silicate glass (FSG), low-k material, another suitable material or a combination thereof.

Numerous advantages are associated with the embodiments described above. The insulating liner 132 provides additional thermal conduction paths during the resistive memory device 108 operation leading to efficient heat dissipation from the resistive layer 110. The insulating liner 132 also minimizes migration of oxygen vacancies and metal atoms from the resistive layer 110 to the ILD layers 100 and 136 and from the ILD layers 100 and 136 to the resistive layer 110.

Figure 2A:
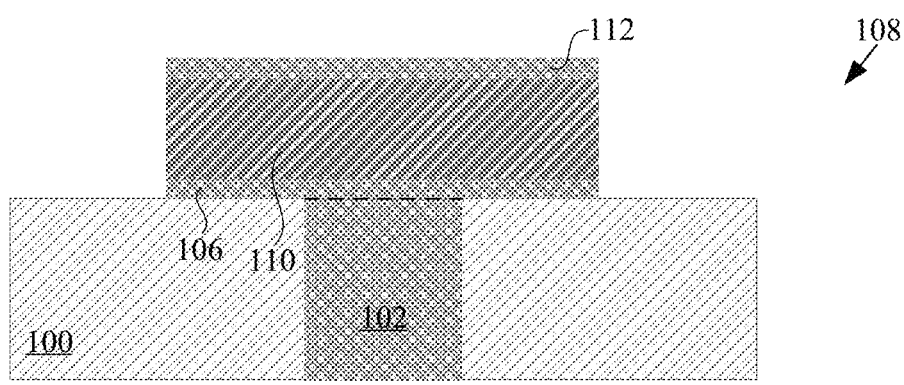
FIGS. 2A to 2D illustrate a fabrication process flow for the resistive memory device illustrated in FIG. 1A, according to embodiments of the disclosure.

FIGS. 2A to 2D illustrate a fabrication process flow for the resistive memory device 108 shown in FIG. 1, according to embodiments of the disclosure. FIG. 2A is a cross-section view of a partially completed resistive memory device 108, according to embodiments of the disclosure. Referring to FIG. 2A, a first contact 102 may be provided in the ILD layer 100. A first electrode 106 may be provided adjacent to the first contact 102 and the ILD layer 100. A resistive layer 110 may be provided adjacent to the first electrode 106, the resistive layer 110 having at least a sidewall. The resistive layer 110 may be made of hafnium oxide ($HfO_2$), tantalum oxide ($Ta_2O_5$), titanium oxide ($TiO_2$), aluminum oxide ($Al_2O_3$), zirconium oxide ($ZrO_2$), magnesium oxide (MgO), nickel oxide (NiO), germanium oxide (GeO), silicon dioxide ($SiO_2$), tungsten trioxide ($WO_3$), titanium oxynitride (TiON), silicon nitride (SiN), aluminum nitride (AlN) amorphous silicon (a-Si), any other suitable material or its combination. A second electrode 112 may be provided adjacent to the resistive layer 110. The formation of the first and second electrodes, 106 and 112, respectively, and the resistive layer 110 is known in the art and will not be further elaborated upon.

Figure 2B:
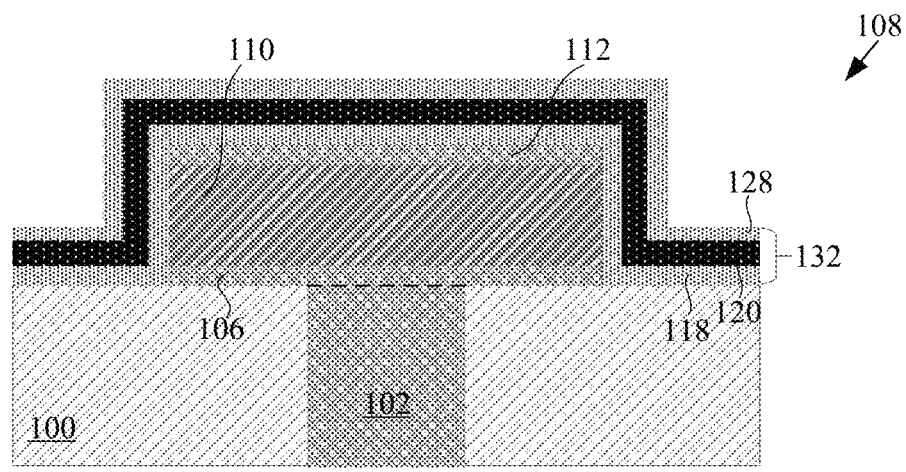

FIG. 2B is a cross-section view of a partially completed resistive memory device 108 after deposition of an insulating liner 132, according to embodiments of the disclosure. Referring to FIG. 2B, the insulating liner 132 may be deposited over at least a sidewall of the first electrode 106, at least a sidewall of the resistive layer 110, at least a sidewall and a top surface of the second electrode 112 and over the ILD layer 100. The deposition process may be by chemical vapor deposition (CVD), physical vapor deposition (PVD) or atomic layer deposition (ALD). The insulating liner 132 comprises two layers, a first layer 118 and a second layer 120, the first layer 118 and the second layer 120 may be made of different dielectric materials. The insulating liner 132 may further comprise a third layer 128 formed on the second layer 120.

Figure 2C:
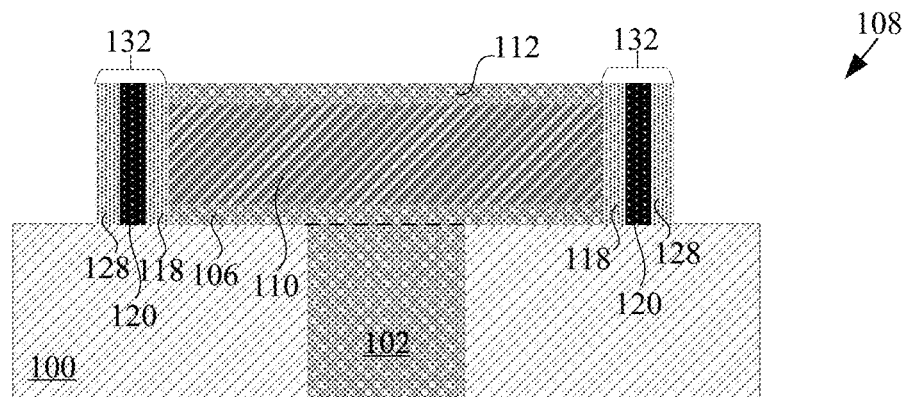

FIG. 2C is a cross-section view of a partially completed resistive memory device 108 after partial removal of the insulating liner 132, according to embodiments of the disclosure. A portion of the insulating liner 132 may be removed from at least the top surface of the second electrode 112 and from the ILD layer 100. The removal process may leave behind the insulating liner 132 on at least the sidewall of the resistive layer 110. In one embodiment, the insulating liner 132 is formed on at least the sidewall of the first electrode 106. In further embodiments, the insulating liner 132 is formed on at least the sidewall of the second electrode 112. The removal process may be by wet etch or dry etch. In one embodiment, the removal process may be by anisotropic etching. The term "anisotropic etching" may refer to an etching process which does not proceed in all directions at the same rate. If etching proceeds exclusively in one direction (e.g. only vertically), the etching process is said to be completely anisotropic.

Figure 2D:
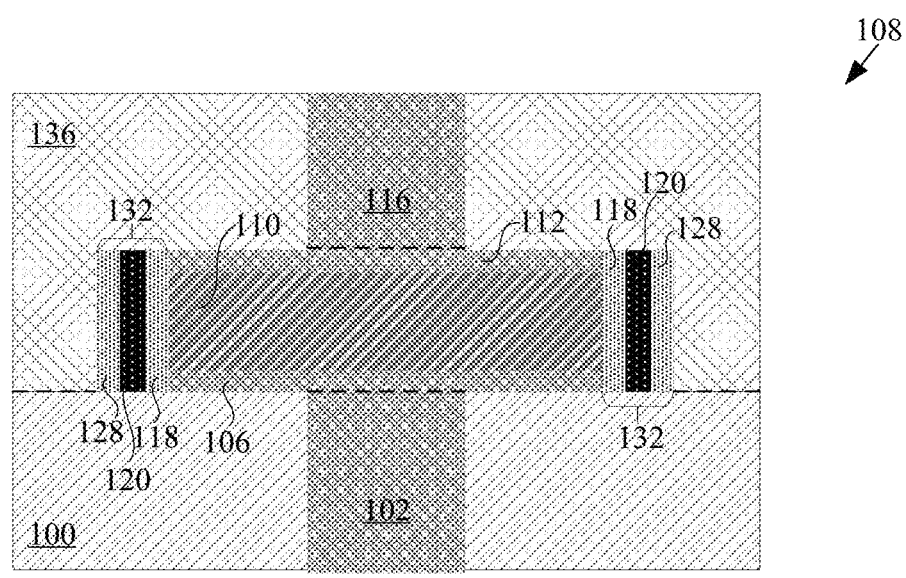

FIG. 2D is a cross-section view of a resistive memory device 108 after formation of a second contact 116 adjacent to the second electrode 112, according to embodiments of the disclosure. A second ILD layer 136 may be deposited over the ILD layer 100, the insulating liner 132, the first electrode 106, the resistive layer 110 and the second electrode 112 prior to the formation of the second contact 116. The second ILD layer 136 may be deposited by CVD, PVD or ALD. The formation of the second contact 116 may include forming an opening in the second ILD layer 136 over the second electrode 112 and forming a contact metal in the opening. The formation of the opening may include depositing a photoresist layer over the second ILD layer 136 and developing the photoresist layer to leave behind a suitable photoresist pattern. A wet etch or dry etch process may be used to remove a portion of the second ILD layer 136 that is not covered by the photoresist pattern, thereby forming an opening in the second ILD layer 136. The formation of a contact metal in the opening may include depositing a suitable conductive material by ALD, CVD or PVD to fill up the opening and over upper surfaces of the second ILD layer 136. A suitable planarization process such as chemical mechanical planarization (CMP) may be used to remove the conductive material from the upper surfaces of the second ILD layer 136. The conductive material may comprise aluminum (Al), copper (Cu), tungsten (W), molybdenum (Mo), any other suitable material or its combination.

Figure 3:
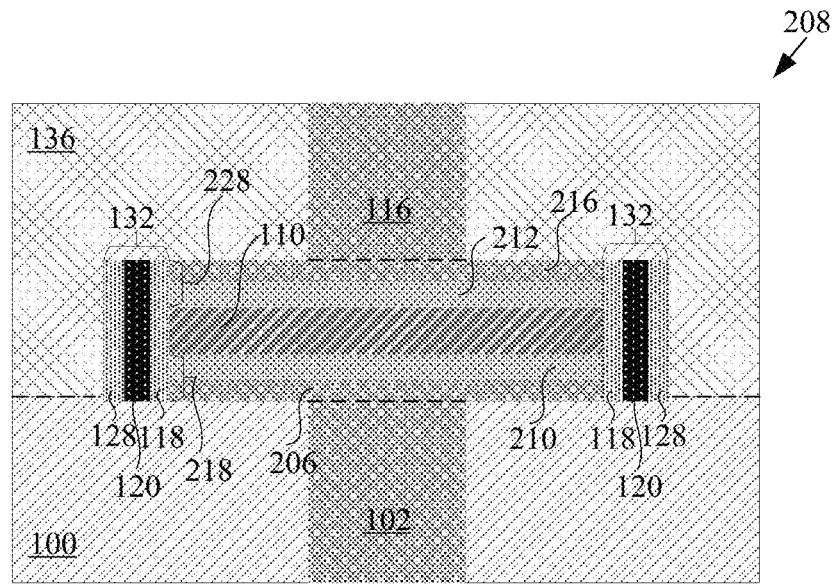
FIG. 3 is a cross-section view of a resistive memory device, according to further embodiments of the disclosure.

The embodiments shown in FIGS. 1 and 2 may be modified to form alternative embodiments without departing from the scope of the disclosure. For example, FIG. 3 is a cross-section view of a resistive memory device 208, according to further embodiments of the disclosure. The same reference numerals used in FIGS. 1 and 2 are also used in FIG. 3 to refer to identical features. In contrast to the resistive memory device 108 illustrated in FIG. 1, the resistive memory device 208 illustrated in FIG. 3 has a first electrode 218 and a second electrode 228 each having at least two layers made of different conducting materials.

Referring to FIG. 3, the resistive memory device 208 may include a first contact 102 in an ILD layer 100. A first electrode 218 may be formed on the first contact 102. The first electrode 218 have at least two layers, a first layer 206 formed adjacent to the first contact 102 and a second layer 210 formed over the first layer 206. A resistive layer 110 may be formed adjacent to the second layer 210 of the first electrode 218, the resistive layer 110 having at least a sidewall. A second electrode 228 may be formed over the resistive layer 110. The second electrode 228 have at least two layers, a first layer 212 adjacent to the resistive layer 110 and a second layer 216 formed over the first layer 212. A second contact 116 may be formed adjacent to the second layer 216 of the second electrode 228.

The first contact 102, the first layer 206 of the first electrode 218, the second layer 216 of the second electrode 228 and the second contact 116 may be made of an electrically conductive material with high thermal conductivity comprising aluminum (Al), copper (Cu), tungsten (W), molybdenum (Mo), any other suitable material or its combination. In one embodiment, the first layer 206 of the first electrode 218 and the second layer 216 of the second electrode 228, may be made of the same material as the first contact 102 and the second contact 116. The second layer 210 of the first electrode 218 and the first layer 212 of the second electrode 228 may be made of an electrically conductive material with low thermal conductivity such as titanium (Ti), tantalum (Ta), titanium nitride (TiN), tantalum nitride (TaN), platinum (Pt), any other suitable material or its combination. The term "low thermal conductivity" may refer to materials having thermal conductivity lower than 100 W/mK at room temperature.

An insulating liner 132 may extend across at least the sidewall of the resistive layer 110, the insulating liner 132 having at least two layers, a first layer 118 and a second layer 120. The first layer 118 and the second layer 120 of the insulating liner 132 may be made of different dielectric materials. The insulating liner 132 may further comprise a third layer 128 formed on the second layer 120. The insulating liner 132 may have a first end portion and a second end portion, the first end portion of the insulating liner 132 may extend across a sidewall of the first electrode 218 and the second end portion of the insulating liner 132 may extend across a sidewall of the second electrode 228.

Figure 4A:
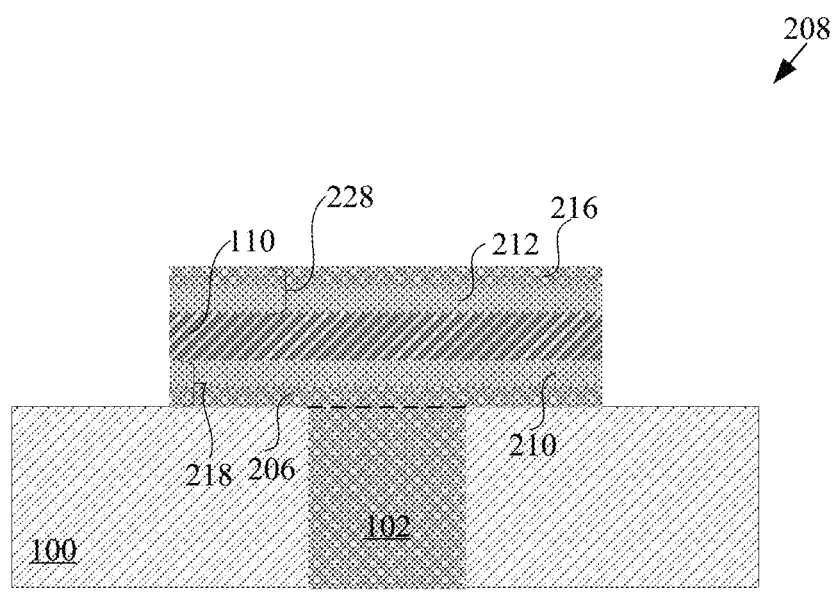
FIGS. 4A to 4D show a fabrication process flow for the resistive memory device shown in FIG. 3, according to embodiments of the disclosure.

FIGS. 4A to 4D show a fabrication process flow for the resistive memory device 208 shown in FIG. 3, according to embodiments of the disclosure. FIG. 4A shows a cross-section view of a partially completed resistive memory device 208, according to embodiments of the disclosure.

Referring to FIG. 4A, a first contact 102 may be provided in the ILD layer 100. A first electrode 218 may be formed over the first contact 102 and the ILD layer 100. The formation of the first electrode 218 may include depositing a layer of electrically conductive material with high thermal conductivity to form the first layer 206. A layer of electrically conductive material with low thermal conductivity may be deposited over the first layer 206 to form the second layer 210 of the first electrode 218. A resistive layer 110 may be deposited over the second layer 210 of the first electrode 218. A layer of electrically conductive material with low thermal conductivity may be deposited over the resistive layer 110 to form a first layer 212 of a second electrode 228. A layer of electrically conductive material with high thermal conductivity may be deposited over the first layer 212 to form the second layer 216 of the second electrode 228. The deposition processes may be by ALD, CVD, PVD or any other suitable deposition processes. A layer of photoresist material may be deposited over the second electrode 228 and developed to form a suitable photoresist pattern. A wet etch or dry etch process may be used to remove a portion of the second electrode 228, resistive layer 110 and the first electrode 218 not covered by the photoresist pattern thereby leaving behind a portion of the first electrode 218, the resistive layer 110 and the second electrode 228 to form the partially completed resistive memory device 208.

Figure 4B:
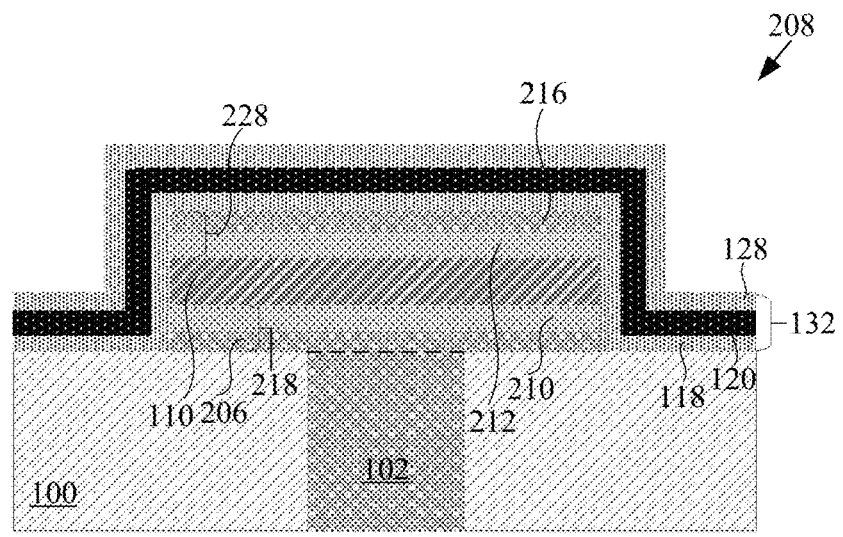

FIG. 4B is a cross-section view of a partially completed resistive memory device 208 after deposition of an insulating liner 132, according to embodiments of the disclosure. Referring to FIG. 4B, the insulating liner 132 may be deposited over at least a sidewall of the first electrode 218, a sidewall of the resistive layer 110 and a sidewall of the second electrode 228 and over at least a top surface of the second electrode 228.

Figure 4C:
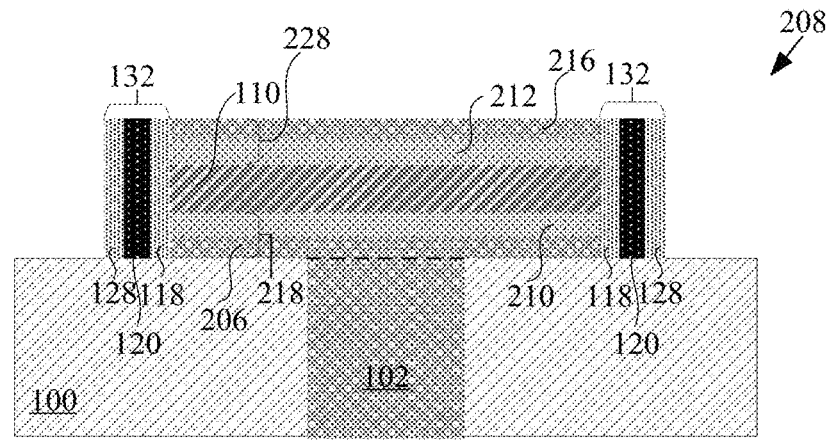

FIG. 4C is a cross-section view of a partially completed resistive memory device 208 after partial removal of the insulating liner 132, according to embodiments of the disclosure. The insulating liner 132 may be removed from at least the top surface of the second electrode 228 leaving behind the insulating liner 132 over at least the sidewall of the resistive layer 110. In one embodiment, the insulating liner 132 may be formed on at least the sidewall of the first electrode 218. In further embodiments, the insulating liner 132 may be formed on at least the sidewall of the second electrode 228.

Figure 4D:
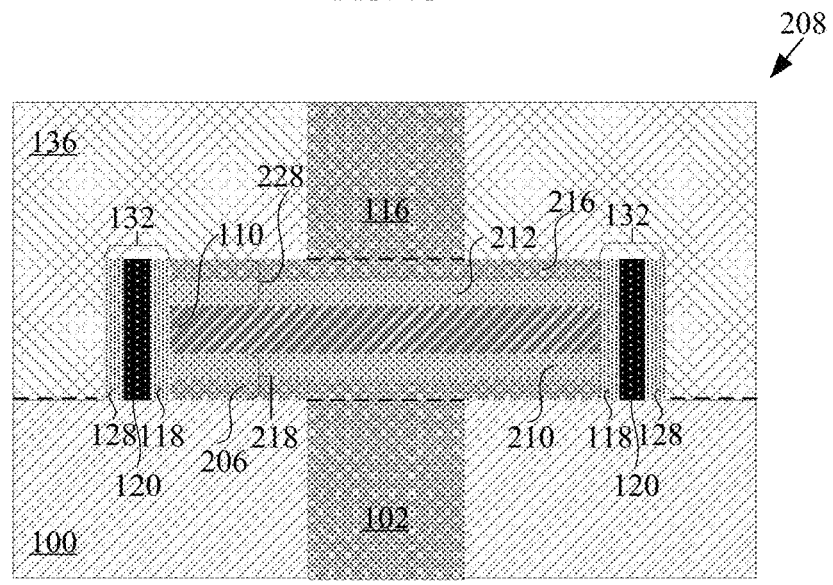

FIG. 4D is a cross-section view of a resistive memory device 208 after formation of a second contact 116 on the second electrode 228, according to embodiments of the disclosure. A second ILD layer 136 may be deposited over the ILD layer 100, the insulating liner 132, the first electrode 218, the resistive layer 110 and the second electrode 228 prior to the formation of the second contact 116. The fabrication of the second contact 116 includes forming an opening in the second ILD layer 136 followed by deposition of a suitable conductive material in the opening.

Figure 5:
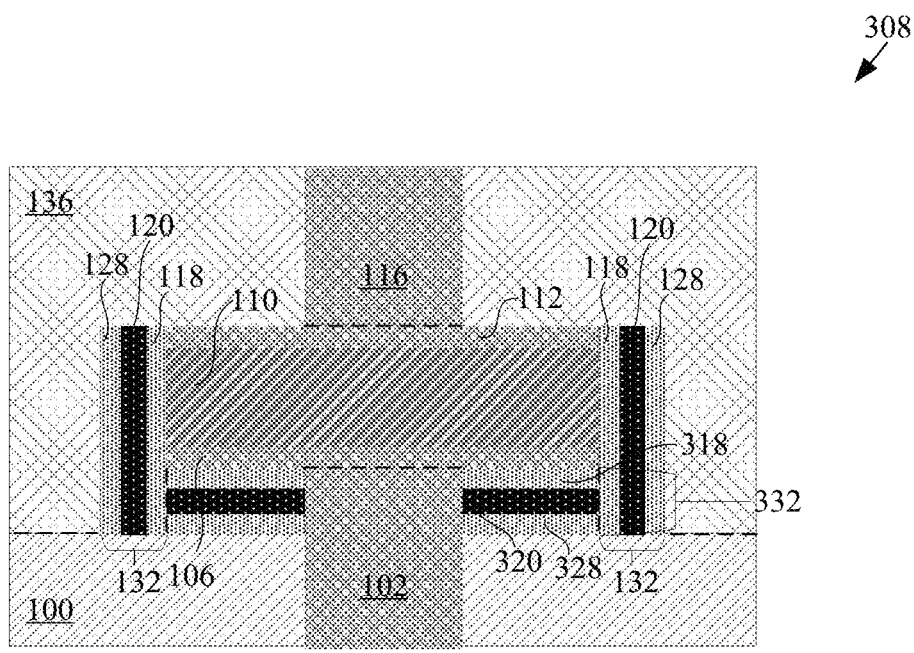
FIG. 5 is a cross-section view of a resistive memory device, according to further embodiments of the disclosure.

FIG. 5 is a cross-section view of a resistive memory device 308, according to further embodiments of the disclosure. Referring to FIG. 5, the resistive memory device 308 comprises a first contact 102 and a first electrode 106 formed on the first contact 102, the first electrode 106 having a bottom surface. In contrast to the resistive memory devices 108 and 208 shown in FIGS. 1 and 3 respectively, the resistive memory device 308 includes an insulating liner 332 formed on at least the bottom surface of the first electrode 106. The insulating liner 332 may surround an upper portion of the first contact 102. The insulating liner 332 comprises at least two layers, a first layer 318 and a second layer 320, the first layer 318 and the second layer 320 may be made of different dielectric materials. In one embodiment, the first layer 318 may be a barrier layer and the second layer 320 may be made of a dielectric material with high thermal conductivity. The insulating liner 332 may include an optional third layer 328. The third layer 328 may be a barrier layer.

A resistive layer 110 may be formed over the first electrode 106 and a second electrode 112 may be formed on the resistive layer 110, the resistive layer 110 having at least a sidewall. The first electrode 106 may separate the resistive layer 110 from the insulating liner 332. An insulating liner 132 may be formed on at least the sidewall of the resistive layer 110, the insulating liner 132 having at least two layers, a first layer 118 and a second layer 120. The first layer 118 and the second layer 120 of the insulating liner 132 may be made of different dielectric materials. The insulating liner 132 may further include a third layer 128 formed next to the second layer 120 of the insulating liner 132. In one embodiment, the insulating liner 132 may be formed on at least a sidewall of the first electrode 106. In further embodiments, the insulating liner 132 may be formed on at least a sidewall of the second electrode 112. The resistive memory device 308 provides improved thermal dissipation from the resistive layer 110 and the first electrode 106 and improved reliability.

Figure 6A:
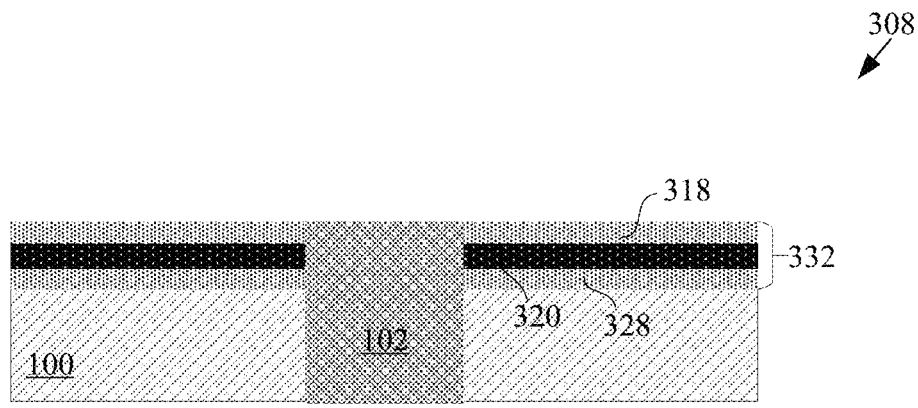
FIGS. 6A to 6F illustrate a fabrication process flow for the resistive memory device shown in FIG. 5, according to embodiments of the disclosure.

FIGS. 6A to 6F illustrate a fabrication process flow for the resistive memory device 308 shown in FIG. 5, according to embodiments of the disclosure. FIG. 6A shows a partially completed resistive memory device 308, according to embodiments of the disclosure.

Referring to FIG. 6A, an ILD layer 100 may be provided. An insulating liner 332 may be deposited on the ILD layer 100. The deposition process may include ALD, CVD, PVD or any other suitable deposition process. A first contact 102 may be formed in the insulating liner 332 and the ILD layer 100. The formation of the first contact 102 may include forming an opening in the insulating liner 332 and the ILD layer 100 followed by depositing a layer of electrically conductive material in the opening. A suitable planarization process such as CMP may be used to remove conductive material from at least a top surface of the insulating liner 332 leaving behind the layer of conductive material in the opening thereby forming the first contact 102.

Figure 6B:
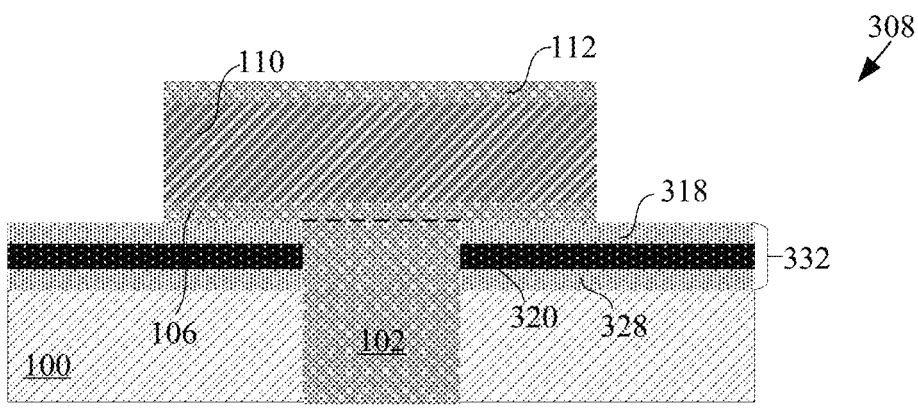

FIG. 6B is a cross-section view of a partially completed resistive memory device 308 after formation of a first electrode 106, a resistive layer 110 adjacent to the first electrode 106 and a second electrode 112 adjacent to the resistive layer 110, according to embodiments of the disclosure. Referring to FIG. 6B, the first electrode 106 may be deposited over the insulating liner 332 and the first contact 102. The resistive layer 110 may be deposited over the first electrode 106. The second electrode 112 may be deposited over the resistive layer 110. The deposition processes may be by CVD, ALD, PVD or any other suitable deposition processes. Side portions of the first electrode 106, the resistive layer 110 and the second electrode 112 may be removed to leave behind center portions of the first electrode 106, the resistive layer 110 and the second electrode 112 over the first contact 102 and the insulating liner 332. The removal process may include depositing a layer of photoresist material over the first electrode 106, the resistive layer 110 and the second electrode 112 followed by developing the photoresist material to form a photoresist pattern. A wet etch or dry etch process may be used to remove portions of the first electrode 106, the resistive layer 110 and the second electrode 112 not covered by the photoresist pattern.

Figure 6C:
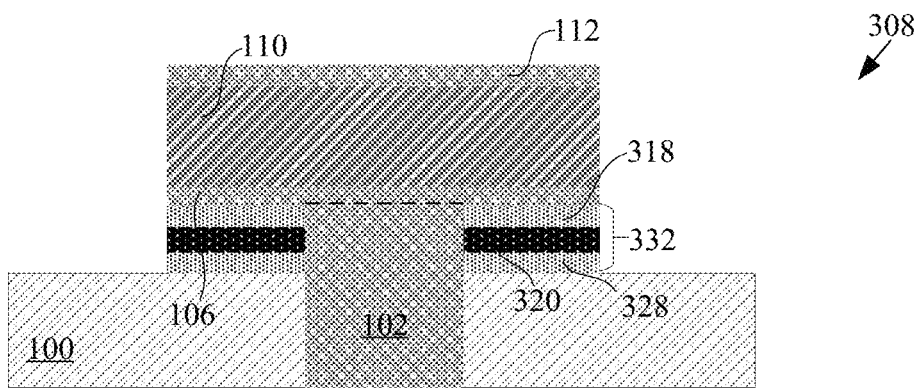

FIG. 6C is a cross-section view of a partially completed resistive memory device 308 after partial removal of the insulating liner 332, according to embodiments of the disclosure. Portions of the insulating liner 332 may be removed by a wet etch or dry etch process, using the first electrode 106, the resistive layer 110 and the second electrode 112 as masking layers. The removal process leaves behind the insulating liner 332 on the bottom surface of the first electrode 106.

Figure 6D:
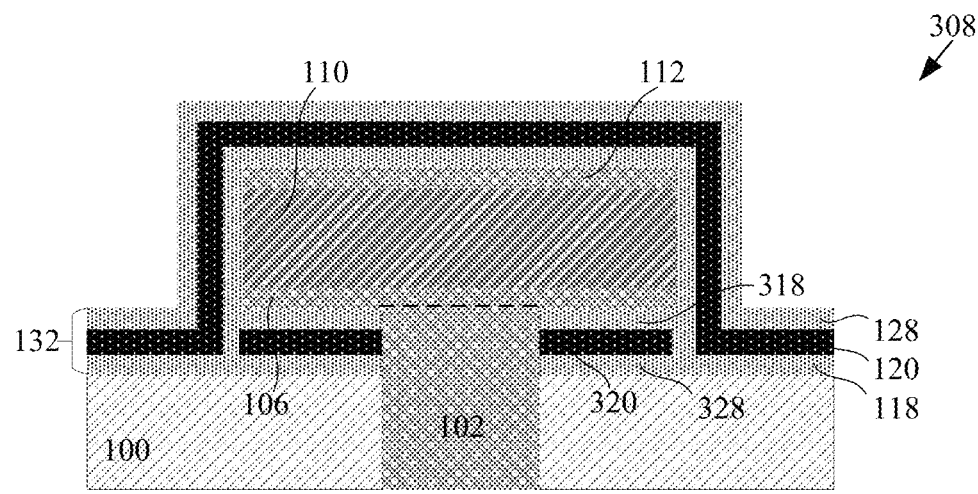

FIG. 6D is a cross-section view of a partially completed resistive memory device 308 after deposition of an insulating liner 132, according to embodiments of the disclosure. The insulating liner 132 may be deposited over at least a side surface of the insulating liner 332, a sidewall of the first electrode 106, a sidewall of the resistive layer 110, at least a sidewall and a top surface of the second electrode 112 and over the ILD layer 100.

Figure 6E:
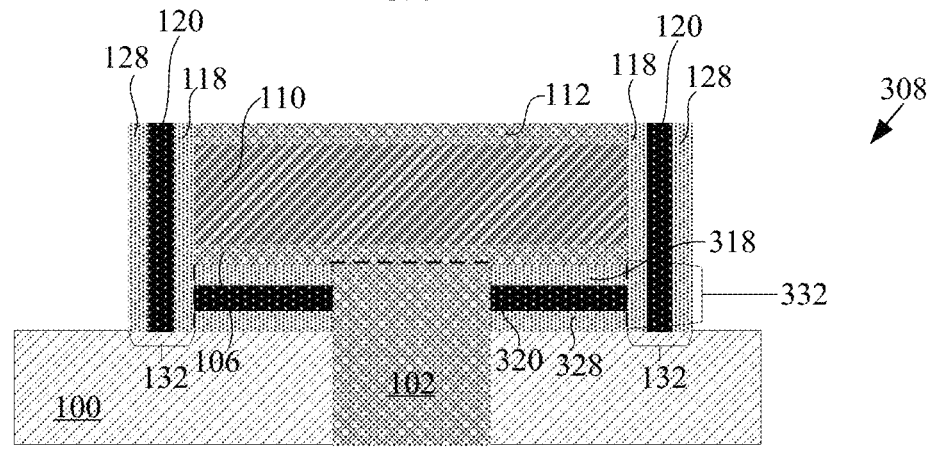

FIG. 6E is a cross-section view of a partially completed resistive memory device 308 after partial removal of the insulating liner 132, according to embodiments of the disclosure. The insulating liner 132 may be removed from at least the top surface of the second electrode 112 and from the ILD layer 100. The removal process leaves behind a portion of the insulating liner 132 over at least a sidewall of the resistive layer 110. In one embodiment, the insulating liner 132 may be formed on at least a sidewall of the first electrode 106. In further embodiments, the insulating liner 132 may be formed on at least a sidewall of the second electrode 112. In further embodiments, the insulating liner 132 may be formed on at least a side surface of the insulating liner 332. The insulating liner 132 may be removed by anisotropic etching.

Figure 6F:
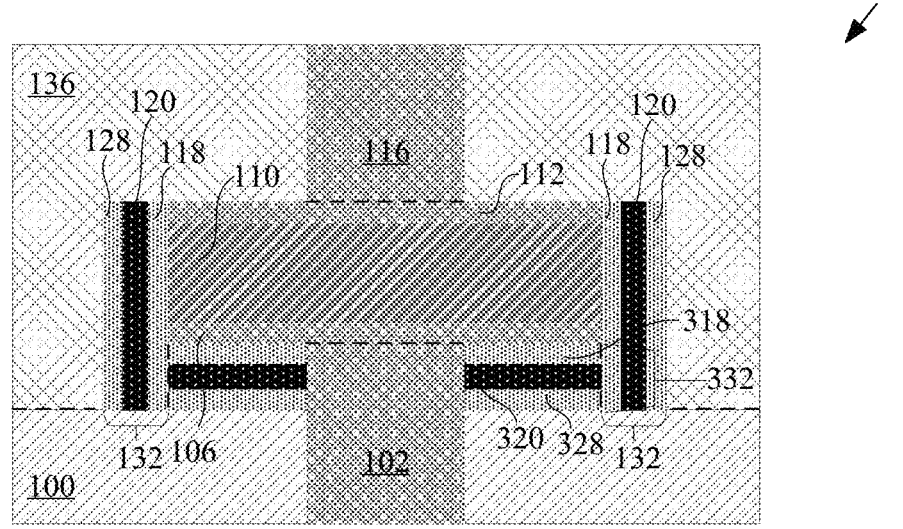

FIG. 6F is a cross-section view of a resistive memory device 308 after formation of a second contact 116 adjacent to the second electrode 112, according to embodiments of the disclosure. The formation of a second contact 116 includes deposition of a second ILD layer 136 over the insulating liners 132 and 332, the first electrode 106, the resistive layer 110 and the second electrode 112. An opening over the second electrode 112 may be formed in the second ILD layer 136 and a suitable conductive material may be subsequently formed in the opening to form the second contact 116.

Figure 7:
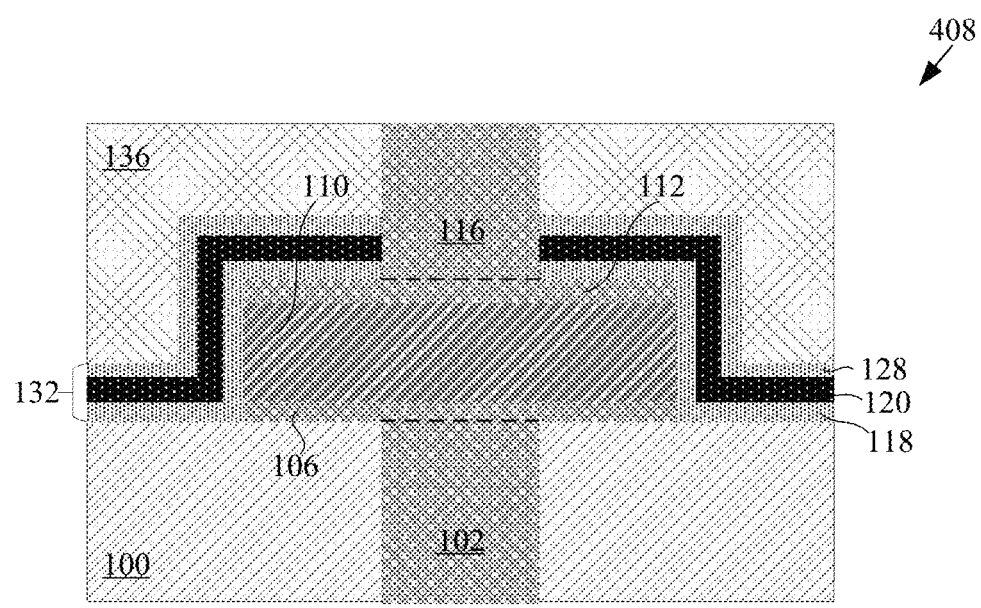
FIG. 7 is a cross-section view of a resistive memory device, according to further embodiments of the disclosure.

FIG. 7 is a cross-section view of a resistive memory device 408, according to further embodiments of the disclosure. The resistive memory device 408 includes a first contact 102 and a first electrode 106 formed adjacent to the first contact 102, a resistive layer 110 formed adjacent to the first electrode 106 and a second electrode 112 formed adjacent to the resistive layer 110. A second contact 116 may be formed adjacent to the second electrode 112. In contrast to the resistive memory devices 108, 208 and 308 shown in FIGS. 1, 3 and 5, respectively, the resistive memory device 408 includes an insulating liner 132 extending over at least a top surface of the second electrode 112, the insulating liner 132 surrounds the second contact 116. The insulating liner 132 may extend over at least a sidewall of the second electrode 112, a sidewall of the resistive layer 110 and a sidewall of the first electrode 106.

Figure 8A:
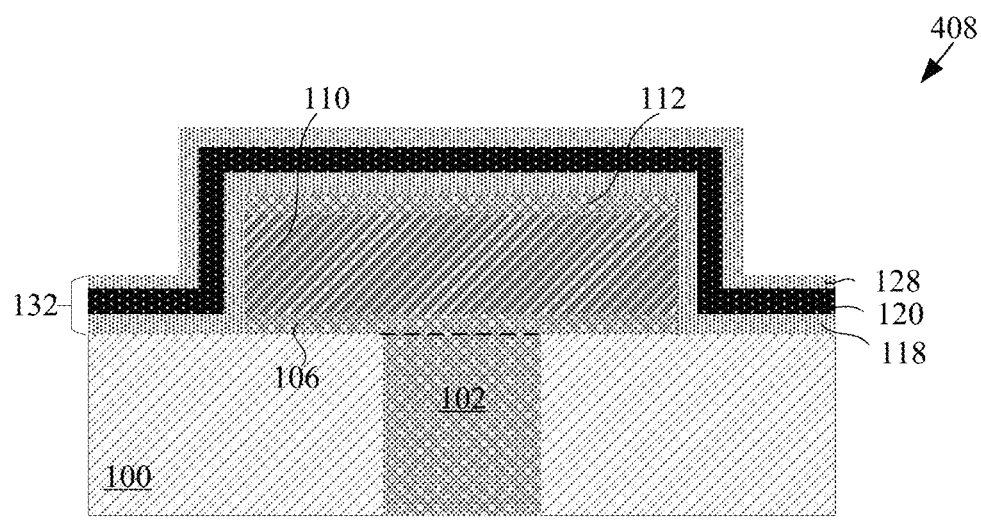
FIGS. 8A to 8C show a fabrication process flow for the resistive memory device shown in FIG. 7, according to embodiments of the disclosure.
Figure 8B:
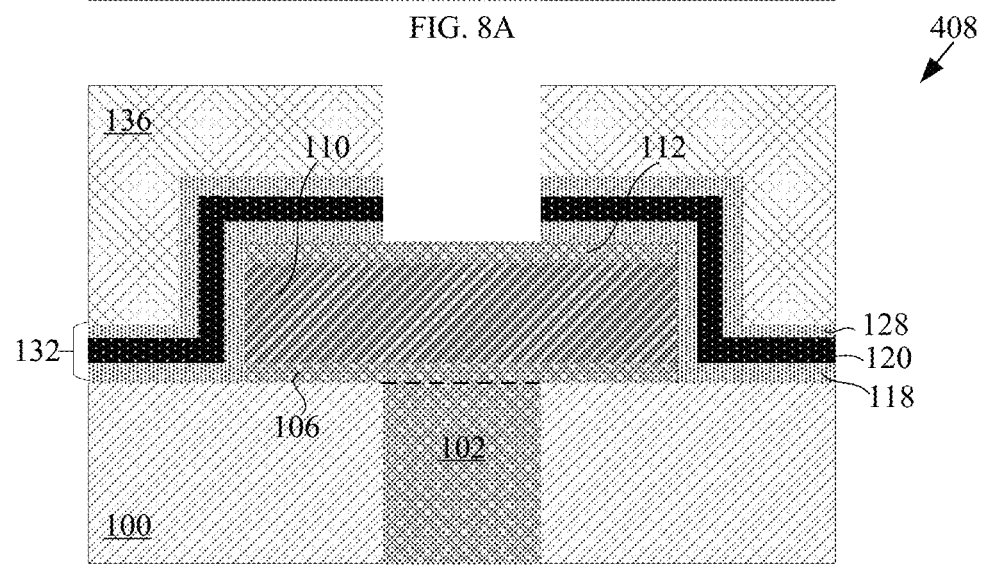
Figure 8C:
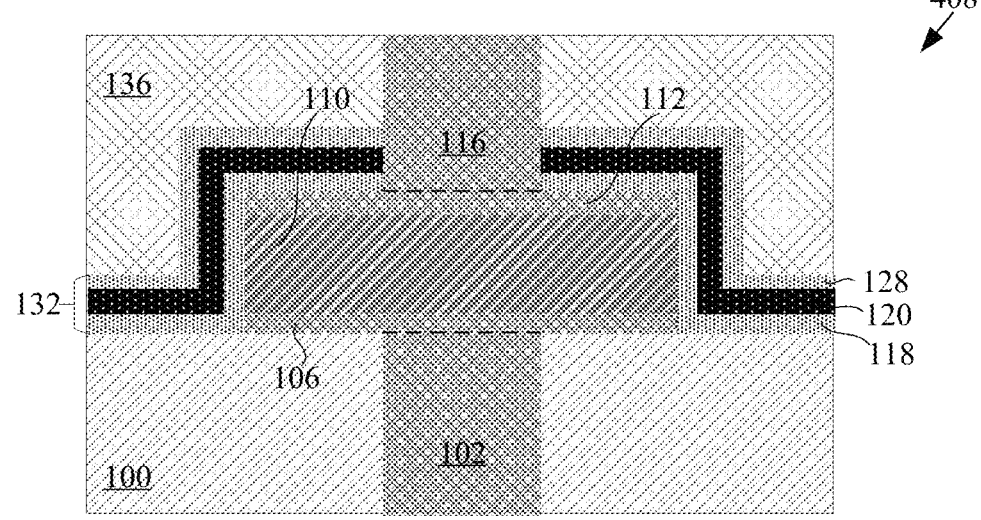

FIGS. 8A to 8C show a fabrication process flow for the resistive memory device 408 shown in FIG. 7, according to embodiments of the disclosure. FIG. 8A is a cross-section view of a partially completed resistive memory device 408, according to embodiments of the disclosure. The fabrication process shown in FIG. 8A is similar to the fabrication process flow illustrated in FIGS. 2A and 2B. Referring to FIG. 8A, a first contact 102 may be provided in an ILD layer 100. A first electrode 106 adjacent to the first contact 102 and the ILD layer 100 may be provided. A resistive layer 110 adjacent to the first electrode 106 and a second electrode 112 adjacent to the resistive layer 110 may be provided. An insulating liner 132 may be deposited over the ILD layer 100, at least a sidewall of the first electrode 106, at least a sidewall of the resistive layer 110 and over at least a sidewall and a top surface of the second electrode 112.

FIG. 8B is a cross-section view of a partially completed resistive memory device 408 after deposition of an ILD layer 136 and formation of an opening in the ILD layer 136 and the insulating liner 132, according to embodiments of the disclosure. Referring to FIG. 8B, the formation of the opening in the ILD layer 136 and the insulating liner 132 may include depositing a layer of photoresist material over the ILD layer 136 and the insulating liner 132 and developing the photoresist material to form a photoresist pattern. A wet etch or dry etch process may be used to remove portions of the ILD layer 136 and the insulating liner 132 not covered by the photoresist pattern, thereby exposing the second electrode 112.

FIG. 8C is a cross-section view of a resistive memory device 408 after formation of a second contact 116 on the second electrode 112, according to embodiments of the disclosure. The second contact 116 may be surrounded by the insulating liner 132. The formation of the second contact 116 may include formation of a suitable conductive material in the opening in the ILD layer 136 and the insulating liner 132. The resistive memory device 408 provides improved thermal dissipation from the resistive layer 110 and the second electrode 112 together with a simple and low cost fabrication process.

Figure 9:
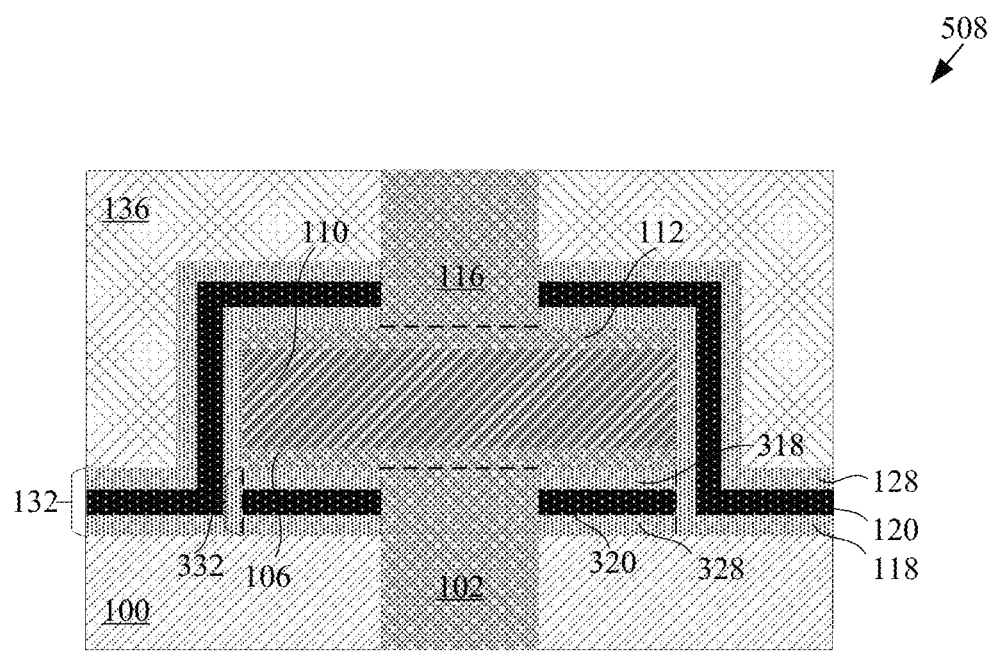
FIG. 9 is a cross-section view of a resistive memory device, according to further embodiments of the disclosure.

FIG. 9 is a cross-section view of a resistive memory device 508, according to further embodiments of the disclosure. Referring to FIG. 9, the resistive memory device 508 comprises a first contact 102 and a first electrode 106 formed adjacent to the first contact 102. A resistive layer 110 may be formed adjacent to the first electrode 106, the resistive layer 110 having at least a sidewall. A second electrode 112 may be formed adjacent to the resistive layer 110. A second contact 116 may be formed adjacent to the second electrode 112. The resistive memory device 508 may include an insulating liner 332 formed adjacent to a bottom surface of the first electrode 106. The insulating liner 332 may surround the first contact 102. The insulating liner 332 having at least two layers, a first layer 318 and a second layer 320. The first layer 318 of the insulating liner 332 may be made of a different dielectric material from the second layer 320. The insulating liner 332 may further include a third layer 328. The third layer 328 of the insulating liner 332 may be made of the same dielectric material as the first layer 318. An insulating liner 132 may extend over at least a side surface of the insulating liner 332, a sidewall of the first electrode 106, a sidewall of the resistive layer 110 and at least a sidewall and a top surface of the second electrode 112. The insulating liner 132 may surround the second contact 116. The insulating liner 132 having at least two layers, a first layer 118 and a second layer 120, the first layer 118 and the second layer 120 being made of different dielectric materials. The insulating liner 132 may further include a third layer 128. The third layer 128 of the insulating liner 132 may be made of the same dielectric material as the first layer 118. The resistive memory device 508 provides enhanced thermal dissipation from the first electrode 106, the resistive layer 110 and the second electrode 112.

Figure 10A:
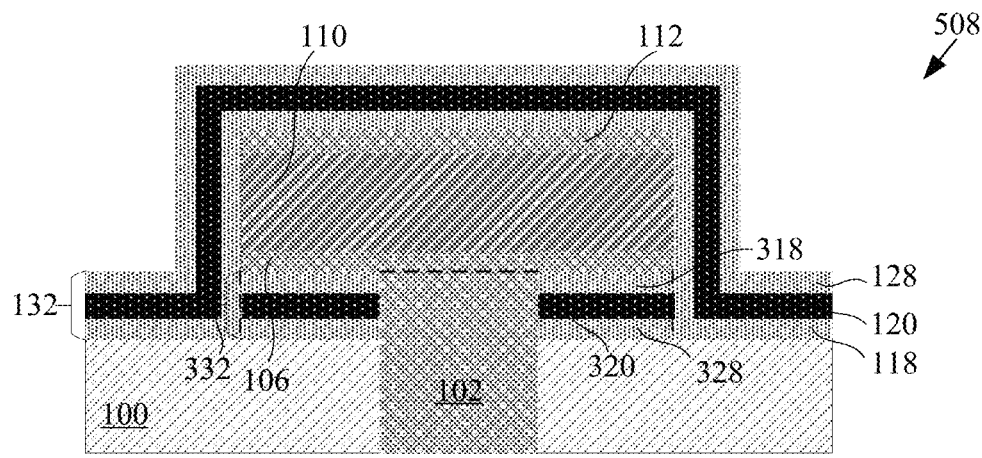
FIGS. 10A to 10C show a fabrication process flow for the resistive memory device shown in FIG. 9, according to embodiments of the disclosure.
Figure 10B:
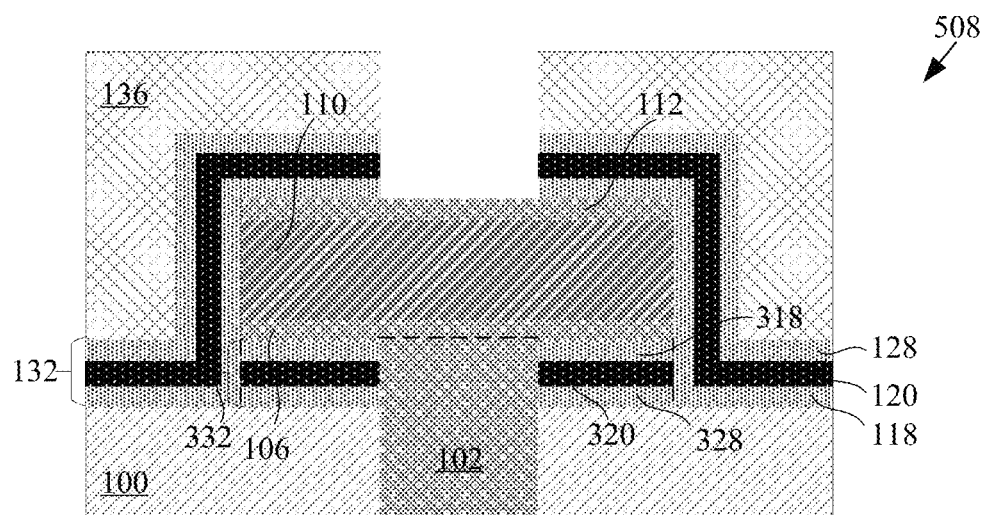
Figure 10C:
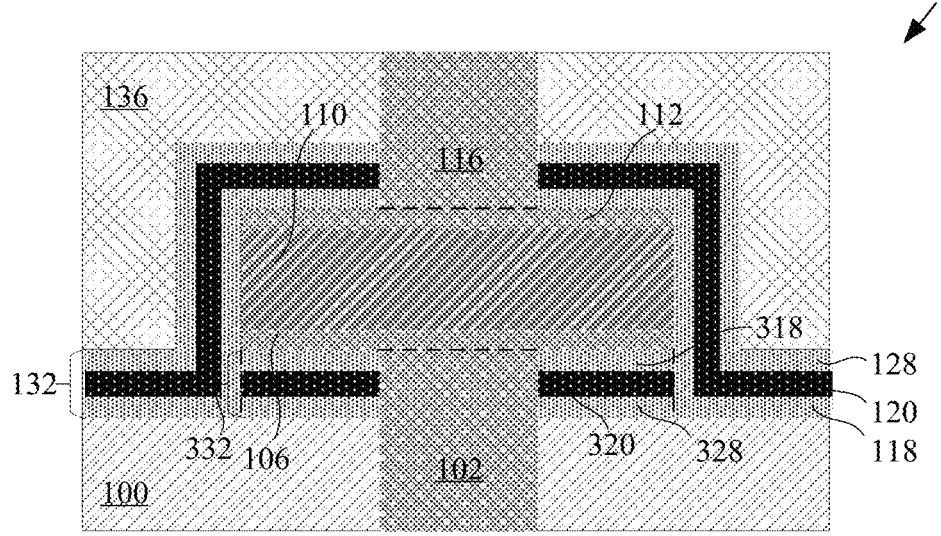

FIGS. 10A to 10C show a fabrication process flow for the resistive memory device 508 shown in FIG. 9, according to embodiments of the disclosure. FIG. 10A shows a partially completed resistive memory device 508, according to embodiments of the disclosure. The fabrication process for the partially completed resistive memory device 508 shown in FIG. 10A is similar to the fabrication process flow shown in FIGS. 6A to 6D.

Referring to FIG. 10A, an insulating liner 332 may be provided over an ILD layer 100. A first contact 102 may be formed in the insulating liner 332 and the ILD layer 100. A first electrode 106 may be formed adjacent to the first contact 102 and the insulating liner 332. A resistive layer 110 may be formed adjacent to the first electrode 106. A second electrode 112 may be formed adjacent to the resistive layer 110. An insulating liner 132 may be formed over a top surface of the ILD layer 100, at least a side surface of the insulating liner 332, a sidewall of the first electrode 106, a sidewall of the resistive layer 110, at least a sidewall and a top surface of the second electrode 112.

FIG. 10B is a cross-section view of a partially completed resistive memory device 508 after deposition of an ILD layer 136 and formation of an opening in the ILD layer 136 and the insulating liner 132. The ILD layer 136 may be deposited over the insulating liner 132, thereby surrounding the insulating liner 132. An opening may be formed by depositing a layer of photoresist material over the ILD layer 136 and the insulating liner 132 and developing the photoresist material to form a suitable photoresist pattern. A wet etch or dry etch process may be used to remove portions of the ILD layer 136 and the insulating liner 132 not covered by the photoresist pattern thereby forming the opening. The opening in the ILD layer 136 and the insulating liner 132 may expose the second electrode 112.

FIG. 10C is a cross-section view of a resistive memory device 508 after formation of a second contact 116, according to embodiments of the disclosure. The formation of the second contact 116 on the first electrode 112 may include formation of a suitable conductive material in the opening in the ILD layer 136 and the insulating liner 132.

Figure 11:
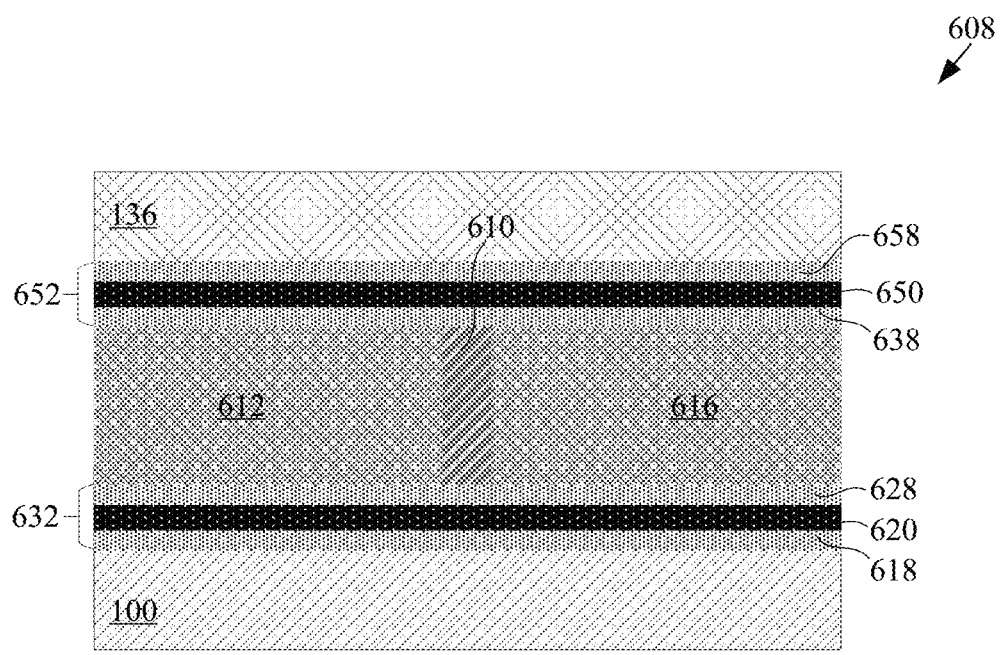
FIG. 11 is a cross-section view of a resistive memory device, according to further embodiments of the disclosure.

FIG. 11 is a cross-section view of a resistive memory device 608, according to further embodiments of the disclosure. The resistive memory device 608 may be a planar ReRAM having a first electrode 612, a resistive layer 610 and a second electrode 616 placed on the same plane or on a horizontal plane. Referring to FIG. 11, the resistive memory device 608 may include an ILD layer 100. An insulating liner 632 may be formed on the ILD layer 100, the insulating liner 632 having a first layer 618 and a second layer 620 on the first layer 618, the first layer 618 and the second layer 620 may be made of different dielectric materials. In one embodiment, the first layer 618 may be a barrier layer and the second layer 620 may be made of a material with high thermal conductivity. A third layer 628 may be formed on the second layer 620, the third layer 628 may be a barrier layer.

A first electrode 612, a resistive layer 610 and a second electrode 616 may be formed adjacent to the insulating liner 632. The resistive layer 610 may be formed between the first electrode 612 and the second electrode 616. The resistive layer 610 having at least a bottom surface and the insulating liner 632 may be formed on at least the bottom surface of the resistive layer 610. The first electrode 612 having at least a bottom surface and the insulating liner 632 may be formed on at least the bottom surface of the first electrode 612. The second electrode 616 having at least a bottom surface and the insulating liner 632 may be formed on at least the bottom surface of the second electrode 616.

An insulating liner 652 may be formed on a top surface of the first electrode 612, the resistive layer 610 and the second electrode 616. The insulating liner 652 having at least two layers, a first layer 638 and a second layer 650 over the first layer 638. The first layer 638 of the insulating liner 652 may be made of a different dielectric material from the second layer 650. The first layer 638 of the insulating liner 652 may be a barrier layer and the second layer 650 may be made of a dielectric material with high thermal conductivity. A third layer 658 may be formed on the second layer 650, the third layer 658 of the insulating liner 652 may be a barrier layer. A second ILD layer 136 may be formed on the insulating liner 652. From a top-down perspective, the resistive memory device 608 may have a square or rectangular shape.

Figure 12A:
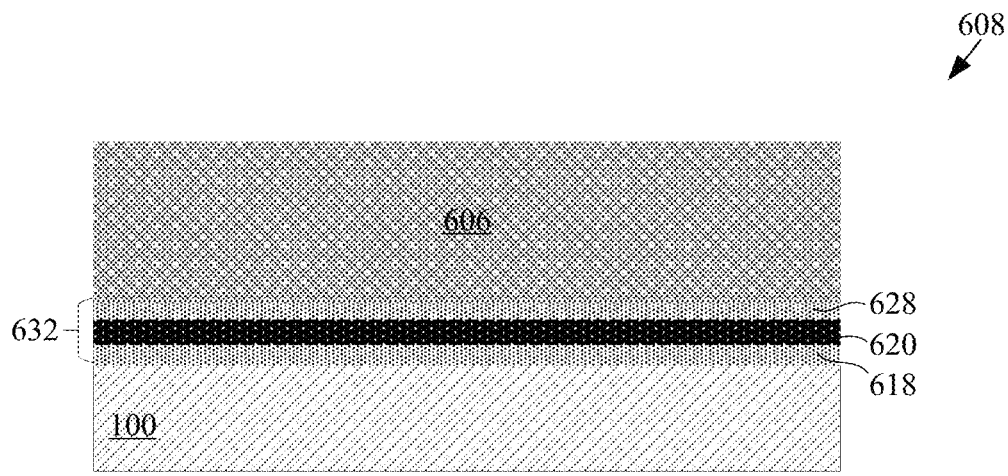
FIGS. 12A to 12C show a fabrication process flow for the resistive memory device shown in FIG. 11, according to embodiments of the disclosure.
Figure 12B:
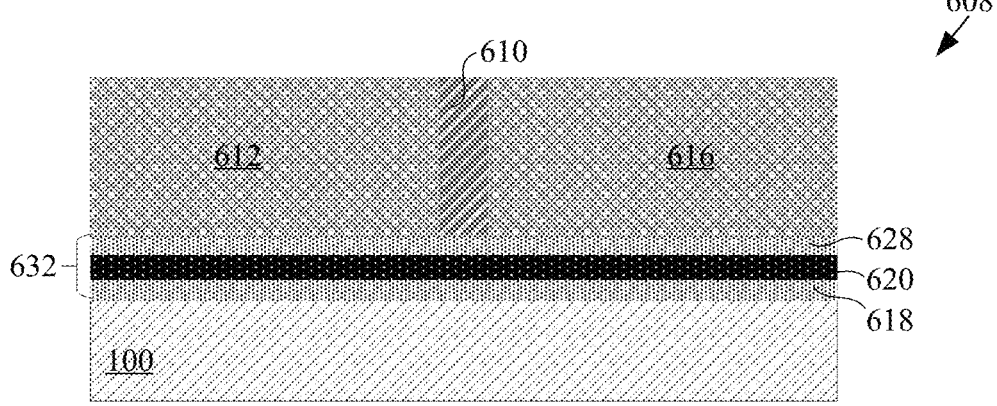
Figure 12C:
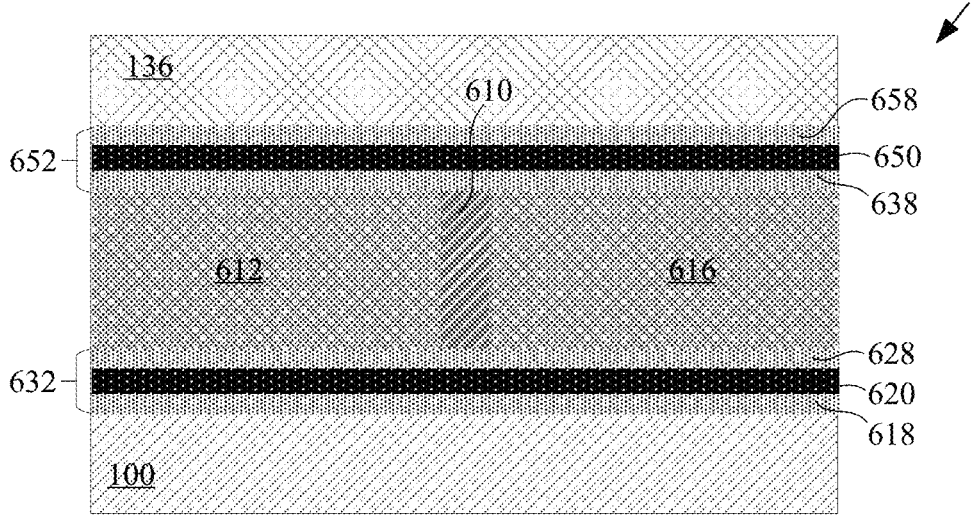

FIGS. 12A to 12C show a fabrication process flow for the resistive memory device 608 shown in FIG. 11, according to embodiments of the disclosure. FIG. 12A shows a cross-section view of a partially completed resistive memory device 608, according to embodiments of the disclosure.

Referring to FIG. 12A, an ILD layer 100 may be provided. An insulating liner 632 may be deposited on the ILD layer 100. A conductive material 606 may be deposited over the insulating liner 632, the conductive material 606 comprising electrically conductive materials with high thermal conductivity such as aluminum (Al), copper (Cu), tungsten (W), molybdenum (Mo), any other suitable material or its combination. The deposition processes for the insulating liner 632 and the conductive material 606 may be by CVD, ALD, PVD or any other suitable deposition processes.

FIG. 12B shows a cross-section view of a partially completed resistive memory device 608 after formation of a first electrode 612, a resistive layer 610 and a second electrode 616, according to embodiments of the disclosure. Referring to FIG. 12B, the formation of the first electrode 612 and the second electrode 616 may include forming an opening in the conductive material 606 thereby separating the first electrode 612 from the second electrode 616. The formation of the opening may include depositing a photoresist layer over the conductive material 606 and developing the photoresist layer to form a photoresist pattern. A wet etch or dry etch process may be used to remove a portion of the conductive material 606 not covered by the photoresist pattern, thereby exposing the insulating liner 632 and forming the opening. A suitable electrically resistive material comprising hafnium oxide ($HfO_2$), tantalum oxide ($Ta_2O_5$), titanium oxide ($TiO_2$), aluminum oxide ($Al_2O_3$), zirconium oxide ($ZrO_2$), magnesium oxide (MgO), nickel oxide (NiO), germanium oxide (GeO), silicon dioxide ($SiO_2$), tungsten trioxide ($WO_3$), titanium oxynitride (TiON), silicon nitride (SiN), aluminum nitride (AlN), amorphous silicon (a-Si), any other suitable material or its combination may be deposited over a top surface of the first electrode 612, the opening between the first electrode 612 and the second electrode 616, and a top surface of the second electrode 616. A suitable planarization process such as CMP may be used to remove the resistive material from the top surfaces of the first electrode 612 and the second electrode 616, thereby leaving the resistive material in the opening to form the resistive layer 610.

FIG. 12C is a cross-section view of a resistive memory device 608 after formation of an insulating liner 652 and a second ILD layer 136, according to embodiments of the disclosure. The formation of the insulating liner 652 may include depositing the insulating liner 652 over a top surface of the first electrode 612, the resistive layer 610 and the second electrode 616. The second ILD layer 136 may be deposited over the insulating liner 652. The deposition processes may be by CVD, PVD, ALD or any other suitable deposition processes.

Figure 13:
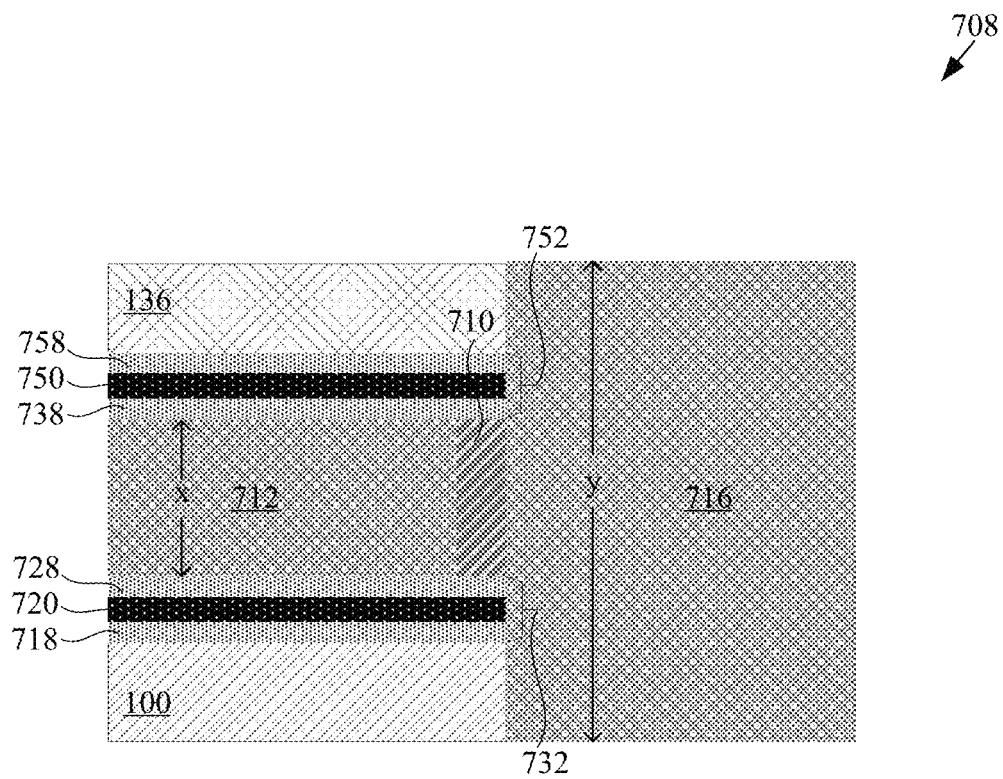
FIG. 13 is a cross-section view of a resistive memory device, according to further embodiments of the disclosure.

FIG. 13 is a cross-section view of a resistive memory device 708, according to further embodiments of the disclosure. The resistive memory device 708 may be a vertical ReRAM. Referring to FIG. 13, the resistive memory device 708 may include a first ILD layer 100. An insulating liner 732 may be formed on the first ILD layer 100, the insulating liner 732 having a first layer 718 and a second layer 720 formed on the first layer 718. The first layer 718 and the second layer 720 may be made of different dielectric materials. In one embodiment, the first layer 718 may be a barrier layer and the second layer 720 may be made of a material with high thermal conductivity. A third layer 728 may be formed on the second layer 720, the third layer 728 may be a barrier layer. A first electrode 712 may be formed on the insulating liner 732, the first electrode 712 having at least a bottom surface and the insulating liner 732 is formed on the bottom surface of the first electrode 712. A resistive layer 710 may be formed next to the first electrode 712, the resistive layer 710 having at least a bottom surface. The insulating liner 732 may be formed on the bottom surface of the resistive layer 710. A second electrode 716 may be formed next to the resistive layer 710.

As shown in FIG. 13, the first electrode 712 has a width x and the second electrode 716 has a width y. The width x of the first electrode 712 is substantially the same as the width of the resistive layer 710. The width y of the second electrode 716 is larger than the width of the resistive layer 710.

The first electrode 712 and the resistive layer 710 may have a top surface and an insulating liner 752 may be formed on at least the top surface of the first electrode 712 and the resistive layer 710. The insulating liner 752 having at least a first layer 738 and a second layer 750 formed on the first layer 738, the first layer 738 and the second layer 750 may be made of different dielectric materials. In one embodiment, the first layer 738 may be a barrier layer and the second layer 750 may be made of a material with high thermal conductivity. A third layer 758 may be formed on the second layer 750. The third layer 758 of the insulating liner 752 may be a barrier layer. A second ILD layer 136 may be formed on the insulating liner 752.

The second electrode 716 may be a rectangular or circular pillar and the first ILD layer 100, the insulating liner 732, the resistive layer 710, the first electrode 712, the insulating liner 752 and the second ILD layer 136 may surround the second electrode 716. The first electrode 712 may be a planar electrode, separated from the second electrode 716 by the resistive layer 710. The insulating liner 732 may be formed below the bottom surface of the resistive layer 710, connecting the first electrode 712 and the second electrode 716. The insulating liner 752 may be formed above the top surface of the resistive layer 710, thereby connecting the first electrode 712 and the second electrode 716. The insulating liners 732 and 752 provide enhanced thermal dissipation for the resistive memory device 708 and improved reliability.

Figure 14A:
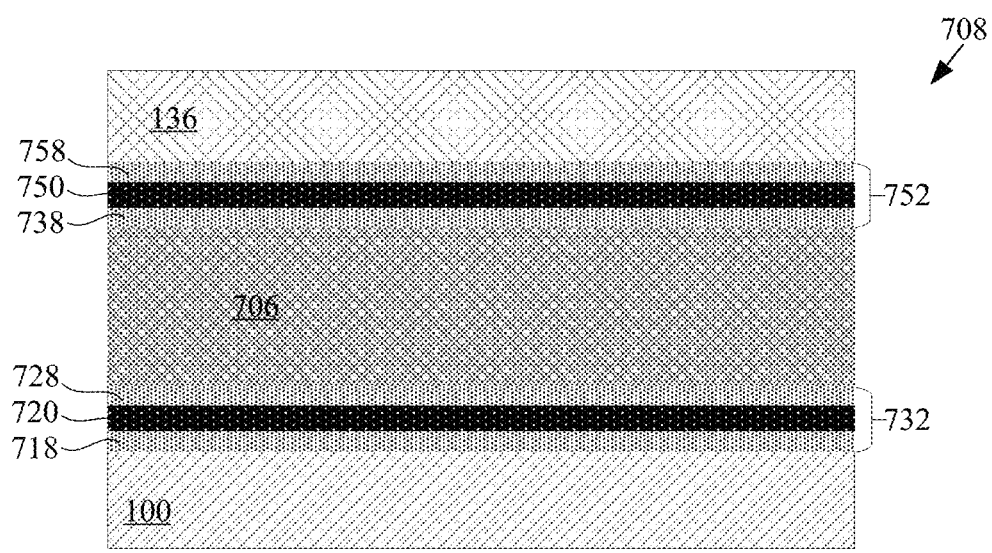
FIGS. 14A to 14C show a fabrication process flow for the resistive memory device shown in FIG. 13, according to embodiments of the disclosure.
Figure 14B:
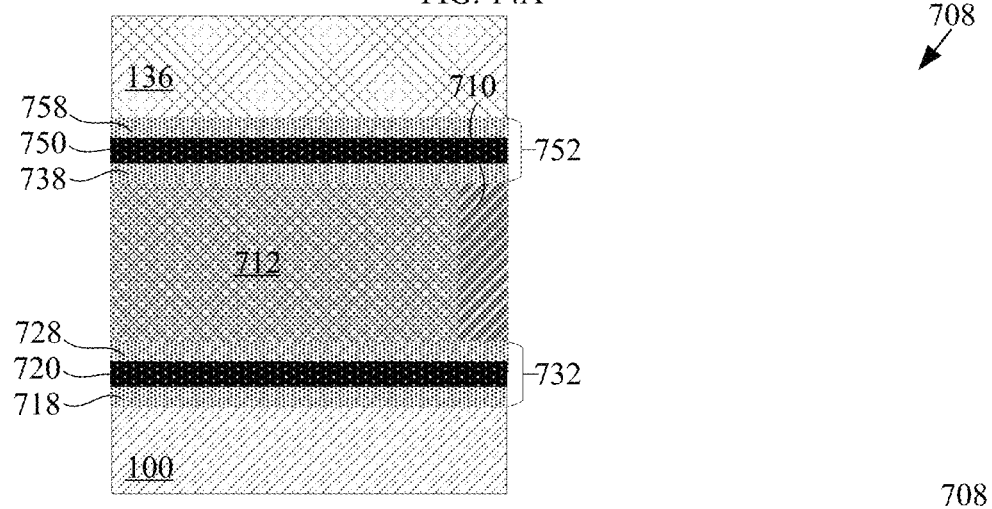
Figure 14C:
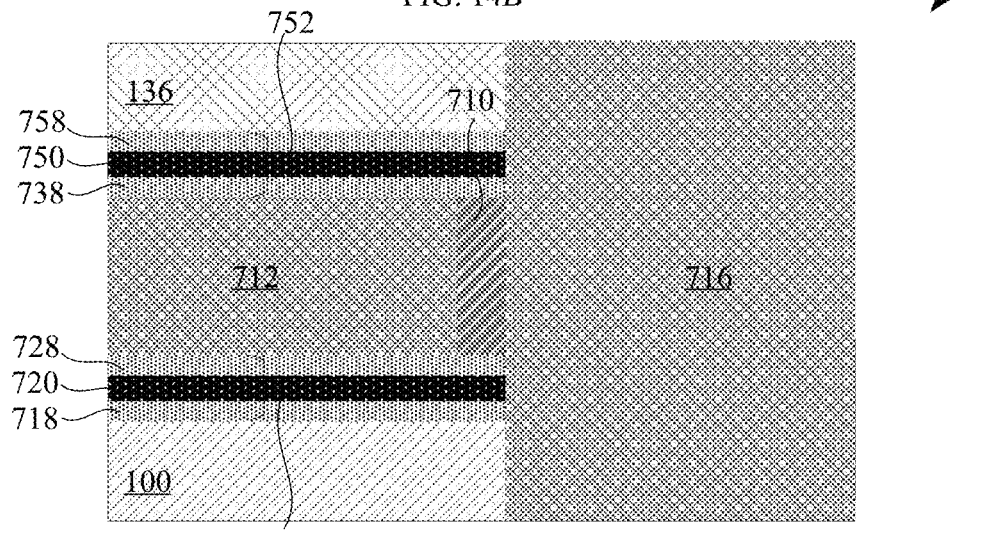

FIGS. 14A to 14C show a fabrication process flow for the resistive memory device 708 shown in FIG. 13, according to embodiments of the disclosure. FIG. 14A shows a partially completed resistive memory device 708, according to embodiments of the disclosure. Referring to FIG. 14A, a first ILD layer 100 may be provided and an insulating liner 732 may be deposited on the first ILD layer 100. A layer of conductive material 706 may be deposited on the insulating liner 732. The layer of conductive material 706 may be made of electrically conductive materials with high thermal conductivity comprising aluminum (Al), copper (Cu), tungsten (W), molybdenum (Mo), any other suitable material or its combination. An insulating liner 752 may be deposited on the layer of conductive material 706 and a second ILD 136 layer may be deposited on the insulating liner 752. The deposition processes may be by CVD, ALD, PVD or any other suitable deposition processes.

FIG. 14B shows a partially completed resistive memory device 708 after formation of the first electrode 712 and the resistive layer 710, according to embodiments of the disclosure. Referring to FIG. 14B, the formation of the first electrode 712 may include removing a first side portion of the second ILD layer 136, the insulating liner 752, the conductive material 706, the insulating liner 732 and the first ILD layer 100 to leave behind a second side portion of the first ILD layer 100, the insulating liner 732, the conductive material 706, the insulating liner 752 and the second ILD layer 136 thereby forming the first electrode 712. The removal process may include depositing a layer of photoresist material over the second ILD layer 136, the insulating liner 752, the conductive material 706, the insulating liner 732 and the first ILD layer 100 followed by developing the photoresist material to form a photoresist pattern. A wet etch or dry etch process may be used to remove a portion of the second ILD layer 136, the insulating liner 752, the conductive material 706, the insulating liner 732 and the first ILD layer 100 not covered by the photoresist pattern.

A side surface of the first electrode 712 may be exposed after the removal process and the side surface may be oxidized by furnace annealing or any other suitable process to form the resistive layer 710. The second ILD layer 136, the insulating liner 752, the first electrode 712, the resistive layer 710, the insulating liner 732 and the first ILD layer 100 may form a side surface of an opening after the removal process.

FIG. 14C is a cross-section view of a resistive memory device 708 after formation of a second electrode 716, according to embodiments of the disclosure. The formation of the second electrode 716 may include depositing a layer of electrically conductive material to fill up the opening thereby forming the second electrode 716. The conductive material may have high thermal conductivity comprising aluminum (Al), copper (Cu), tungsten (W), molybdenum (Mo), any other suitable material or its combination. Although not shown, the layer of conductive material may be deposited over a top surface of the second ILD layer 136 and a suitable planarization process such as CMP may be used to remove the conductive material from the top surface of the second ILD layer 136.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein.

Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed:

1. A resistive memory device comprising:
a first electrode;
a resistive layer over the first electrode, the resistive layer having a sidewall;
a second electrode over the resistive layer;
a first insulating liner on the sidewall of the resistive layer, wherein the first insulating liner comprises two layers of different dielectric materials; and
a second insulating liner adjacent to a bottom surface of the first electrode.

2. The resistive memory device of claim 1, wherein the two layers of the first insulating liner comprises a barrier layer and a layer of a material with high thermal conductivity.

3. The resistive memory device of claim 1, wherein the first electrode comprises a first electrode sidewall and the first insulating liner extends over the first electrode sidewall.

4. The resistive memory device of claim 1, wherein the second electrode comprises a second electrode sidewall and the first insulating liner extends over the second electrode sidewall.

5. The resistive memory device of claim 1, further comprising:
a first contact coupled to the first electrode; and
a second contact coupled to the second electrode,
wherein the first contact and the second contact are made of materials having high thermal conductivity.

6. The resistive memory device of claim 5, wherein the first contact and the second contact comprise aluminum, copper, tungsten or molybdenum.

7. The resistive memory device of claim 5, wherein the first electrode and the second electrode each comprises a single layer made of the same material as the first contact and the second contact.

8. The resistive memory device of claim 5, the first electrode and the second electrode each comprises an inner electrode layer adjacent to the resistive layer and an outer electrode layer adjacent to the respective contacts, wherein the outer electrode layer comprises the same material as the first and second contacts, and the inner electrode layer comprises a material different from the material of first and second contacts.

9. The resistive memory device of claim 1, wherein the second electrode has a top surface and the first insulating liner extends over the top surface of the second electrode.

10. The resistive memory device of claim 1, wherein the resistive layer has a width, the first electrode has a first electrode width that is substantially the same as the width of the resistive layer and the second electrode has a second electrode width that is wider than the width of the resistive layer.

11. A resistive memory device comprising:
a first electrode having a first electrode sidewall;
a resistive layer over the first electrode, the resistive layer having a sidewall;
a first insulating liner extending along the first electrode sidewall and the sidewall of the resistive layer, wherein the first insulating liner comprises a first barrier layer and a second high thermal conductivity layer;
a second insulating liner adjacent to a bottom surface of the first electrode; and
a second electrode over the resistive layer.

12. The resistive memory device of claim 11, wherein the first barrier layer of the first insulating liner comprises silicon nitride or Nblok.

13. The resistive memory device of claim 11, wherein the second high thermal conductivity layer of the first insulating liner comprises aluminum nitride (AlN), boron nitride (BN), gallium nitride (GaN), silicon carbide (SiC), boron phosphide (BP), aluminum phosphide (AlP), gallium phosphide (GaP) or boron arsenide (BAs).

14. The resistive memory device of claim 11, wherein the first barrier layer of the first insulating liner is on the resistive layer and the second high thermal conductivity layer of the first insulating liner is next to the first barrier layer of the first insulating liner.

15. The resistive memory device of claim 11, wherein the second high thermal conductivity layer of the first insulating liner is on the resistive layer and the first barrier layer of the first insulating liner is next to the second high thermal conductivity layer of the first insulating liner.

16. The resistive memory device of claim 14, wherein the first insulating liner further comprises a third layer;
wherein the third layer of the first insulating liner is a barrier layer and is next to the second high thermal conductivity layer of the first insulating liner; and
wherein the third layer of the first insulating liner comprises silicon nitride or Nblok.

17. A method of fabricating a resistive memory device comprising:
forming a first electrode;
forming a resistive layer adjacent to the first electrode;
forming a second electrode adjacent to the resistive layer;
forming a first insulating liner on a sidewall of the resistive layer, wherein the first insulating liner comprises two layers of different dielectric materials; and
forming a second insulating liner adjacent to a bottom surface of the first electrode.

18. The method of claim 17, wherein forming the first insulating liner comprises:
depositing the first insulating liner over a sidewall of the first electrode, the sidewall of the resistive layer, and a sidewall and a top surface of the second electrode; and
removing a portion of the first insulating liner from the top surface of the second electrode such that a remaining portion of the first insulating liner is on the sidewall of the resistive layer.

* * * * *